(12) United States Patent
Matsutori et al.

(10) Patent No.: US 7,357,258 B2
(45) Date of Patent: Apr. 15, 2008

(54) THIN-PLATE SUPPORTING CONTAINER

(75) Inventors: Chiaki Matsutori, Shisui-machi (JP); Tadahiro Obayashi, Shisui-machi (JP)

(73) Assignee: Miraial Co., Ltd. (JP)

( * ) Notice: Subject to any disclaimer, the term of this patent is extended or adjusted under 35 U.S.C. 154(b) by 731 days.

(21) Appl. No.: 10/896,912

(22) Filed: Jul. 23, 2004

(65) Prior Publication Data

US 2005/0115865 A1     Jun. 2, 2005

(30) Foreign Application Priority Data

Dec. 2, 2003   (JP)   ............................. 2003-403663
Dec. 18, 2003  (JP)   ............................. 2003-421482

(51) Int. Cl.
  *B65D 85/28*   (2006.01)
(52) U.S. Cl. ..................... 206/711; 206/454; 206/832
(58) Field of Classification Search ................ 206/454, 206/445, 455, 710, 711, 722, 725, 832, 833; 211/41.18; 118/500
See application file for complete search history.

(56) References Cited

U.S. PATENT DOCUMENTS

| | | | |
|---|---|---|---|
| 6,082,540 A | 7/2000 | Krampotich et al. | ........ 206/445 |
| 6,267,245 B1 | 7/2001 | Bores et al. | ................ 206/711 |
| 2003/0047476 A1* | 3/2003 | Wu et al. | .................... 206/454 |
| 2003/0221985 A1* | 12/2003 | Yajima et al. | ............... 206/454 |
| 2004/0099569 A1 | 5/2004 | Matsutori et al. | ........... 206/710 |
| 2004/0232036 A1 | 11/2004 | Matsutori et al. | |
| 2005/0006325 A1* | 1/2005 | Hua et al. | ................. 211/41.18 |

FOREIGN PATENT DOCUMENTS

| | | |
|---|---|---|
| JP | 2000-184605 | 6/2000 |
| JP | 2002-122382 | 4/2002 |

* cited by examiner

*Primary Examiner*—Jacob K. Ackun, Jr.
(74) *Attorney, Agent, or Firm*—Bacon & Thomas, PLLC

(57) ABSTRACT

The attaching-and-detaching operation of a lid unit, and the operation of taking in and out semiconductor wafers stored in a container body are facilitated. Thin-plate supporting units for supporting semiconductor wafers are provided in the container body of a thin-plate supporting container, and wafer holding units for pressing and supporting the semiconductor wafers, supported by the thin-plate supporting units, from a lid unit side are provided inside a lid unit. The area of a lower surface of a V-shaped groove of the wafer holding unit is increased. The V-shaped groove easily fits the peripheral portion of the semiconductor wafer when attaching the lid unit to the container body. The lower surface of a V-shaped groove of the thin-plate supporting portion is roughened to enhance slipping property with respect to the semiconductor wafer. The angle of inclination of a ridge is determined to be 2 to 5 degrees with respect to the horizontal direction.

12 Claims, 12 Drawing Sheets

THIN-PLATE SUPPORTING CONTAINER

CROSS-REFERENCE TO RELATED APPLICATION

This application claims, under 35 USC 119, priority of Japanese Application No. 2003-403663 filed Dec. 2, 2003 and Japanese Application No. 2003-421482 filed Dec. 18, 2003.

BACKGROUND OF THE INVENTION

1. Field of the Invention

The present invention relates to a thin-plate supporting container for storing thin plates such as semiconductor wafers, storage disks, or liquid crystal glass substrates, which is adapted to be used for storage, for transportation, or in the manufacturing process.

2. Description of the Related Art

A thin-plate supporting container for storage or transportation with thin plates such as semiconductor wafers stored therein is generally known. Such a thin-plate supporting container is disclosed in Japanese Unexamined Patent Application Publication No. 2002-122382. The thin-plate supporting container in this publication will be described referring to FIG. 2.

A thin-plate supporting container 1 mainly includes a container body 2 and a lid unit 3 for closing an opening on top of the container body 2. In the container body 2, there is provided a thin-plate supporting unit 6 for supporting a plurality of semiconductor wafer 4 stored therein at regular intervals. The thin-plate supporting unit 6 includes plate supporting strips 7 for holding the peripheral portions of the semiconductor wafers 4 when the container body 2 is place sideways (the state in which the semiconductor wafers 4 are oriented in the horizontal direction), and V-shaped grooves (not shown) provided on the inner sides of the respective plate supporting strips 7 for supporting the semiconductor wafer 4 at the center portion of the respective plate supporting strips 7 by allowing the semiconductor wafers 4 to fall into the groove bottom when the container body 2 is placed vertically.

On the inner surface of the lid unit 3, there is provided thin-plate holding units 8 for pressing and supporting the semiconductor wafers 4 supported by the thin-plate supporting unit 6 of the lid unit 3 side. The thin-plate holding unit 8 includes V-shaped grooves (not shown) for fitting and supporting the semiconductor wafers 4 by the number corresponding to the number of stored semiconductor wafers 4. The V-shaped grooves have their center positions aligned with the center positions of the V-shaped grooves of the thin-plate supporting unit 6 and formed symmetrically. Accordingly, the V-shaped grooves hold the respective semiconductor wafers 4 at predetermined positions.

Generally, in this thin-plate supporting container 1, the semiconductor wafers 4 are automatically taken out and put by the semiconductor wafer transporting device in a state in which the container body 2 is place sideways, and then the lid unit 3 is attached thereon.

In the case of the thin-plate supporting container 1 as describe above, the semiconductor wafers 4 are displaced form the V-shaped grooves of the thin-plate supporting unit 6 and are placed on the respective plate supporting strips 7 when the container body 2 is placed sideways. Therefore, the semiconductor wafers 4 are in the state of being shifted downward from the groove bottoms of the V-shaped grooves of the thin-plate supporting unit 6.

In contrast, since the V-shaped grooves on the thin-plate holding units 8 on the lid unit 3 side are at the positions aligned with the V-shaped grooves of the thin-plate supporting unit 6 of the container body 2, the semiconductor wafers 4 may shift from the centers of the V-shaped grooves of the thin-plate holding units 8. Therefore, there is a problem in that when attaching the lid unit 3 in a state in which the container body 2 is placed sideways, the V-shaped grooves of the thin-plate holding units 8 cannot be fitted to the peripheral portions of the semiconductor wafers 4 smoothly.

Also, in a state in which the thin-plate supporting container 1 is washed, and hence little dust or dirt is attached on the lower surfaces of the V-shaped grooves, the semiconductor wafers 4 can hardly be run smoothly and may be caught by the lower surface. In this case, since the semiconductor wafer 4 is oriented obliquely, there arises a problem in that the V-shaped grooves of the thin-plate holding units 8 cannot be fitted smoothly on the peripheral portions of the semiconductor wafers 4, or automatic operation in taking the semiconductor wafers 4 in and out by a transporting device may not work properly.

Also, there is a case in that ridges 9A, 9B, and 9C for supporting the semiconductor wafer 4 are formed as the plate supporting strip of the thin-plate supporting unit as shown in FIG. 3. In this case, only one of the ridges 9A, 9B, and 9C is provided. If the position to provide the ridge 9 is too front (like the ridge 9A), the ridge 9A has to be formed inwardly (the position which is significantly extended leftward in the drawing) of a front portion 7A of the plate supporting strip 7, and hence it is difficult to reinforce. Consequently, the plate supporting strip 7 may be deflected and hence the semiconductor wafer 4 may be displaced to a large extent. On the other hand, when the ridge 9 is formed at the position too inside (like the ridge 9C), most part of the weight of the semiconductor wafer 4 is exerted on the ridge 9C, and hence the weight of the semiconductor wafer 4 which is exerted to the lower surface of a V-shaped groove 7B is reduced. Accordingly, a frictional force of the semiconductor wafer 4 placed on the ridge 9C increases, and a force that the semiconductor wafer 4, which is placed on the lower surface of the V-shaped groove 7B of the thin-plate supporting unit 6, slides along the lower surface by its own weight (a force to press the semiconductor wafer 4 forward) is decreased. Accordingly, since the semiconductor wafer 4 is caught by the lower surface and hence is oriented obliquely, there may arise problems such that the V-shaped groove on the thin-plate holding unit 8 cannot fit smoothly on the peripheral portion of the semiconductor wafer 4, or the automatic operation in taking the semiconductor wafer 4 in and out by the transporting device may not work properly.

In addition, when the thin-plate holding units 8 provided on the inner side of the lid unit 3 press and support the plurality of semiconductor wafers 4 stored in the container body 2 simultaneously, the thin-plate holding units 8 receive resilient forces from the respective semiconductor wafers 4. Although the thin-plate holding units 8 are supported by the lid unit 3, since the center portion of the lid unit 3 is low in strength, there is a problem in that the force to press and support the plurality of semiconductor wafers 4 by the thin-plate holding units 8 is also weak at the center portion.

SUMMARY OF THE INVENTION

In view of such circumstances, it is an object of the present invention to provide a thin-plate supporting container in which a lid unit can be attached and detached smoothly, and thin plates can be taken in and out smoothly in a state in which the container body is placed sideways, and the strength of a thin-plate holding unit can be maintained to a preset value.

A first aspect of the invention is a thin-plate supporting container including a container body for storing a plurality of thin plates therein, a lid unit for closing the container body, a thin-plate supporting unit provided in the container body for supporting the thin plates stored therein at regular intervals, thin-plate holding units provided on the lid unit for pressing and supporting the thin plates supported by the thin-plate supporting unit from the lid unit side, and V-shaped grooves provided on the thin-plate supporting unit and on the thin-plate holding units for fitting and supporting the thin plates, characterized in that the areas of the lower side surfaces of the V-shaped grooves, which are positioned on the lower sides in a state in which the respective semiconductor wafers are oriented in the horizontal direction, are increased.

In this arrangement, when the lid unit is attached in a state in which the container body is placed sideways, the V-shaped grooves, of which the area of the lower side surfaces are increased, smoothly fit the peripheral portions of the thin plates supported by the thin-plate supporting unit and oriented in the horizontal direction.

A second aspect of the invention is a thin-plate supporting container including a container body for storing a plurality of thin plates therein, a lid unit for closing the container body, a thin-plate supporting unit provided in the container body for supporting the thin plates stored therein at regular intervals, thin-plate holding units provided on the lid unit for pressing and supporting the thin plates supported by the thin-plate supporting unit from the lid unit side, and V-shaped grooves provided on the thin-plate supporting unit and on the thin-plate holding units for fitting and supporting the thin plates, characterized in that the V-shaped grooves in the thin-plate holding units are shifted downward in a state in which the thin plates are oriented in the horizontal direction.

In this arrangement, when the lid unit is attached in a state in which the container body is placed sideways, the downwardly shifted V-shaped grooves fit the peripheral portions of the thin plates supported by the thin-plate supporting unit and oriented in the. horizontal direction.

In addition to the first or second aspects of the invention, a thin-plate supporting container according to a third aspect of the invention is characterized in that the surfaces of the V-shaped grooves of the thin-plate supporting unit, which is located on the lower side in a state in which the thin plates are oriented in the horizontal direction, are roughened.

In this arrangement, since the lower surfaces of the V-shaped grooves are roughened, slipping property increases. Accordingly, when the container body is placed sideways, the thin plates placed on the lower surface of the V-shaped grooves slip along the inclined lower surface due to their own weights and are placed on a plate supporting strip.

In addition to any one of the first to third aspects of the invention, a thin-plate supporting container according to a fourth invention is characterized in that the plate supporting strip of the thin-plate supporting unit, on which the thin plate is placed in a state in which the thin plates are oriented in the horizontal direction, is provided with a ridge which comes into direct contact with the thin plate and supports the same, and the ridge is formed in the vicinity of the point where a frictional force of the thin plate which is placed on the ridge and a force that the thin plate, which is placed on the lower surface of the V-shaped groove of the thin-plate supporting unit, slips along the lower surface by its own weight are balanced.

In this arrangement, the frictional force of the thin plate placed on the ridge is smaller than the force that the thin plate slides along the lower surface of the V-shaped groove. In other words, since the force that the thin plate, which is placed on the lower surface of the V-shaped groove of the thin-plate supporting unit, slides along the lower surface by its own weight is larger than the frictional force acting on the thin plate placed on the ridge, when the container body is placed sideways, the thin plate slides downward along the lower surface of the V-shaped groove of the thin-plate supporting unit, and is placed on the plate supporting strip.

In addition to the fourth aspect of the invention, a thin-plate supporting container according to a fifth invention is characterized in that the angle of inclination of the ridge is set to 2 to 5 degrees with respect to the horizontal line.

In this arrangement, the thin plate comes into contact at the peripheral portion thereof with the ridge at an angle of 2 to 5 degrees, and hence the frictional force is decreased.

In addition to the first to fifth aspect of the invention, a thin-plate supporting container according to a sixth aspect of the invention is characterized in that the groove bottoms of a number of V-shaped grooves disposed in a number of thin-plate supporting units disposed in parallel are protruded toward the lid unit at the center portion respectively with respect to the both end portions thereof.

In this arrangement, the upper ends of thin plates located at the center portion, out of the plurality of thin plates stored in the container body, are protruded toward the lid unit in comparison with the upper ends of the thin plates located at both end portions in a state in which the container body is placed in the vertical direction. Accordingly, even when the center portion of the lid unit is deflected depending on its strength, it is compensated for by the locations of the thin plates. Accordingly, the respective thin plates can be pressed and supported by a uniform force by the thin-plate holding units.

In addition to the first to a sixth embodiment, a thin-plate supporting container according to the seventh aspect of the invention is characterized in that the thin-plate holding unit is reinforced at the center portion in comparison with the both end portions.

In this arrangement, when the plurality of thin plates are stored in the container body and the lid unit is attached thereto, since the strength of the center portion of the lid unit is low, it tends to deflect. However, since the thin-plate holding units at the center portion are reinforced, the thin-plate holding units can press and support the respective thin plates with a uniform force.

DESCRIPTION OF THE PREFERRED EMBODIMENTS

Figure 1:
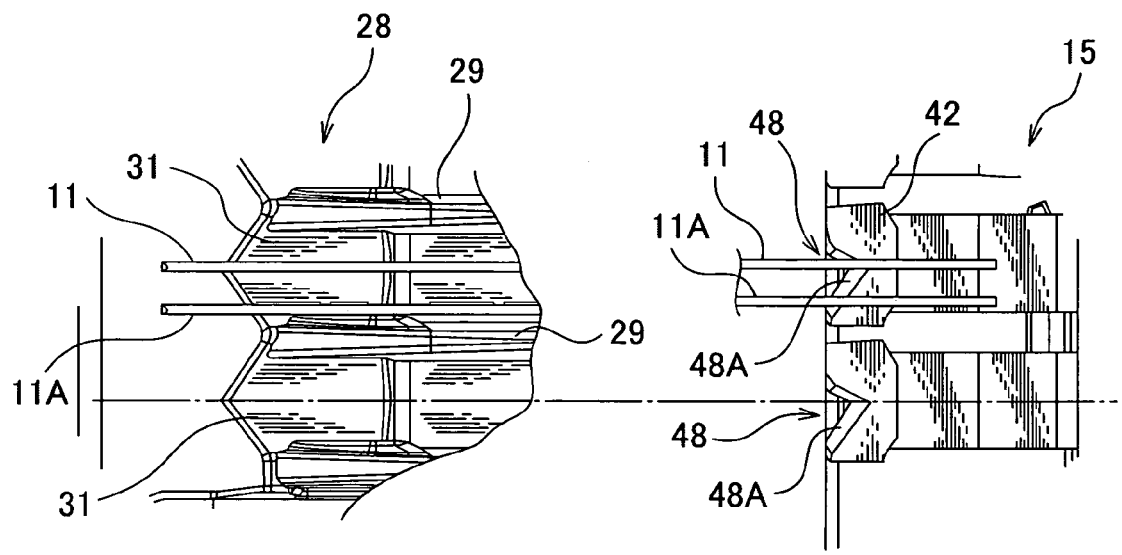
FIG. 1 is an enlarged view showing a principal portion of a V-shaped groove of a thin-plate supporting unit and a wafer holding unit of a thin-plate supporting container according to an embodiment of the invention.

Referring now to the drawings, an embodiment of the invention will be described. A thin-plate supporting container of the invention is a container for storing thin plates such as semiconductor wafers, storage disks, or liquid crystal glass substrates, which is adapted to be used for storage, for transportation, or in the manufacturing line. Here, an example of the thin-plate supporting container for storing semiconductor wafers will be described.

Figure 4:
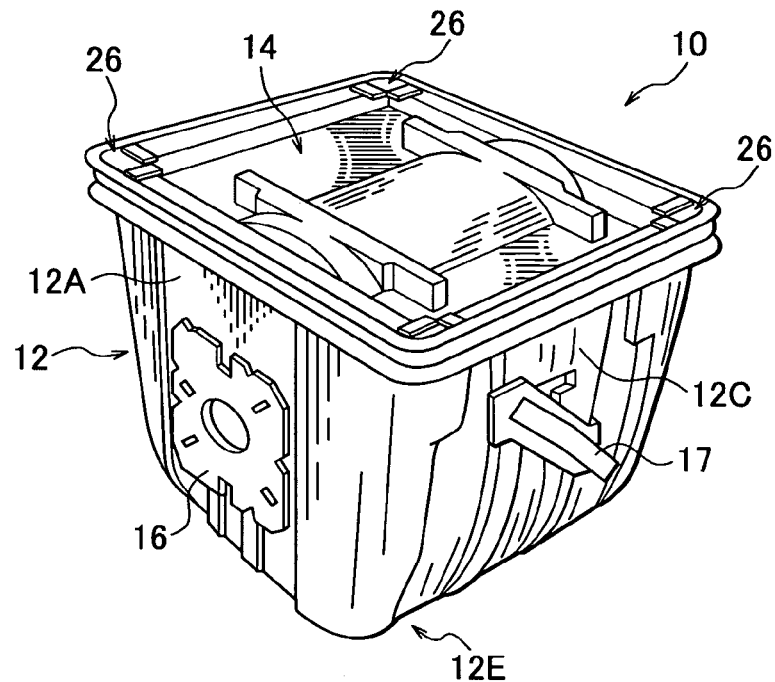
FIG. 4 is a perspective view showing the thin-plate supporting container according to the embodiment of the invention.
Figure 5:
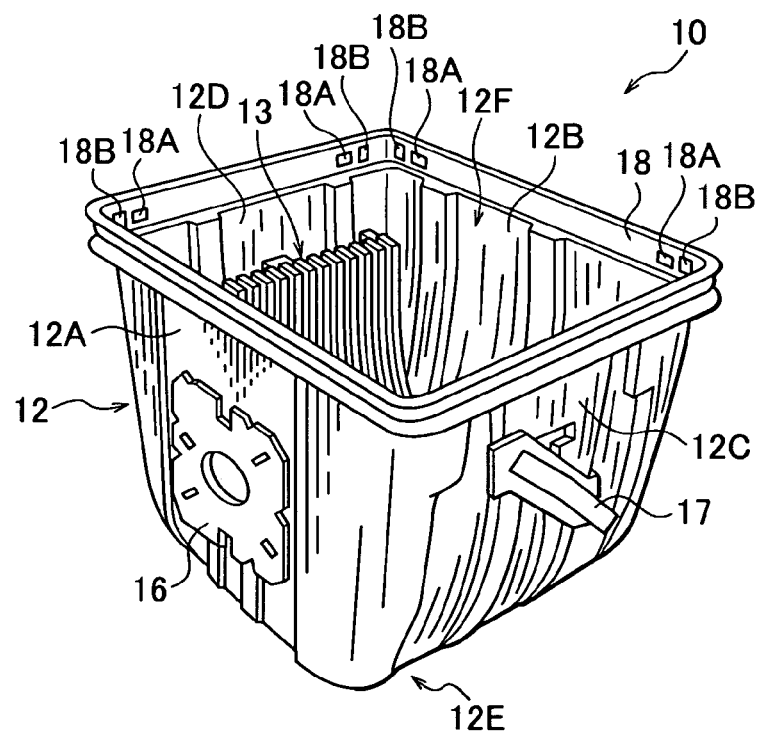
FIG. 5 is a perspective view of the thin-plate supporting container according to the embodiment of the invention with a lid unit removed.

As shown in FIGS. 4 and 5, a thin-plate supporting container 10 according to the present embodiment includes a container body 12 for storing a plurality of semiconductor wafers 11 (See FIG. 9) therein, two thin-plate supporting units 13 provided respectively on opposed side walls in the container body 12 for supporting the semiconductor wafers 11 stored therein from both sides, a lid unit 14 for closing the container body 12, a wafer holding unit 15 (See FIG. 15) provided on the inner side of the lid unit 14 as a thin-plate holding unit for pressing and supporting the semiconductor wafer 11, a top flange 16 to be clamped by an arm portion of a transporting device (not shown) in a plant, and a carrying handle 17 to be held by an operator when carrying the thin-plate supporting container 10 by hand.

The container body 12 is generally formed into a cubic shape. The container body 12 includes four side walls 12A, 12B, 12C, 12D, which corresponds to a surrounding wall, and a bottom plate 12E in a state of being vertically placed (the state shown in FIGS. 4 and 5), and an opening 12F is provided on top thereof. The container body 12 is placed sideways when installed so as to oppose a wafer transporting device (not shown) in a manufacturing line of the semiconductor wafers 11. On the outside of the side wall 12B which corresponds to the bottom in the state of being placed sideways is provided with a positioning unit (not shown) of the thin-plate supporting container 10. On the outside of the side wall 12A which corresponds to the ceiling in the state of being placed sideways a top flange 16 is detachably attached thereon. On the outer side of the side walls 12C, 12D which corresponds to the lateral wall in a state of being placed sideways, there are detachably provided carrying handles 17. The side walls 12A, 12B, 12C and 12D of the container body 12 each are provided with a lid unit receiving member 18 to which the lid unit 14 is fitted at the upper edges thereof. The lid unit receiving member 18 is provided with receiving devices 18A, 18B for receiving a simplified attaching-and-detaching mechanism 26 of the lid unit 14, which will be described later, for fixing the lid unit 14 to the container body 12 at four corners thereof. The receiving devices 18A, 18B are formed into a shape which corresponds to various types of simplified attaching-and-detaching mechanism so that they can be used for a plurality of types of the lid unit 14.

Figure 6:
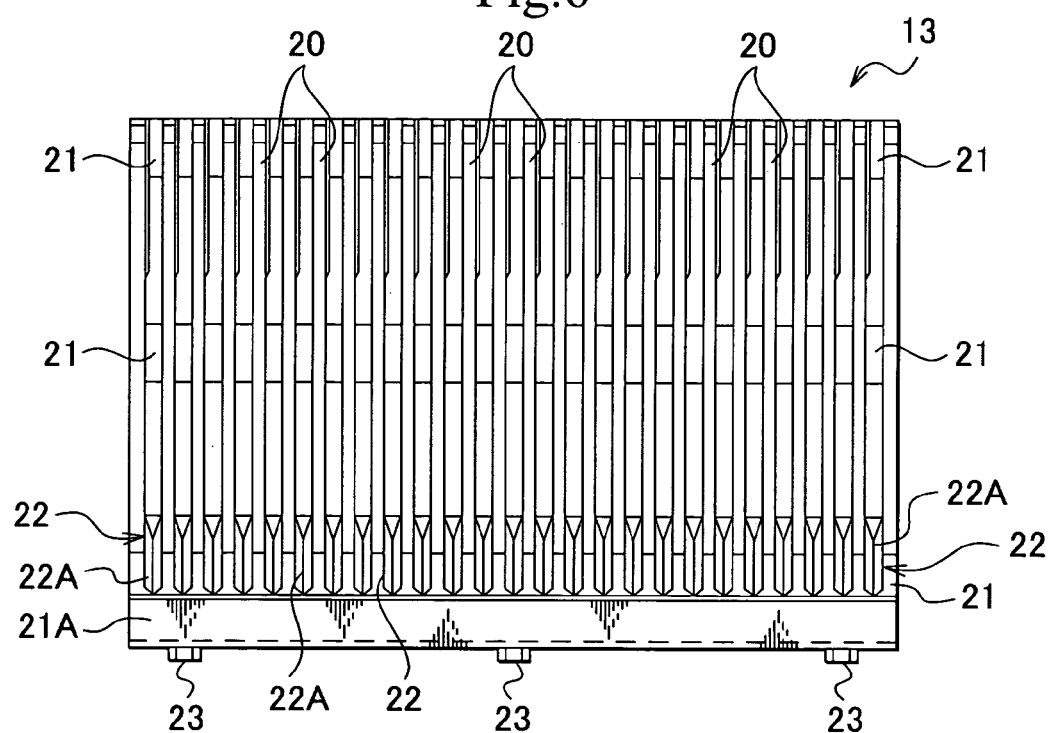
FIG. 6 is a front view showing the thin-plate supporting unit of the thin-plate supporting container according to the embodiment of the invention.
Figure 7:
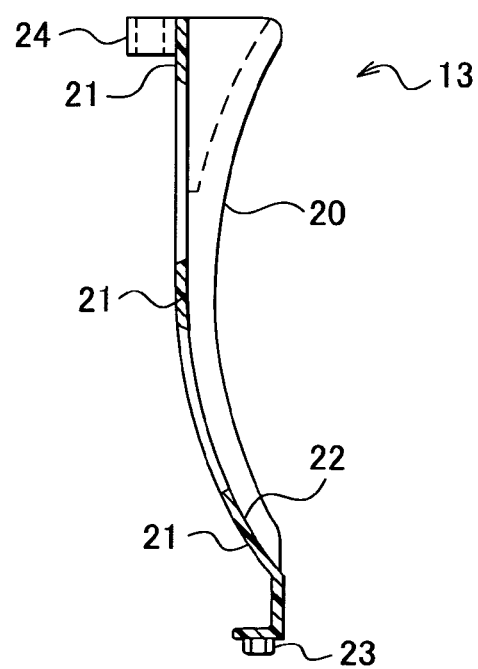
FIG. 7 is a side view showing the thin-plate supporting unit of the thin-plate supporting container according to the embodiment of the invention.

The thin-plate supporting unit 13 is detachably attached to the container body 12. The thin-plate supporting unit 13 is configured as shown in FIG. 6 and FIG. 7. The thin-plate supporting unit 13 mainly includes a number of plate supporting strips 20 disposed in parallel at regular intervals for holding the respective semiconductor wafers 11 one by one, connecting plate strips 21 for integrally supporting the respective plate supporting strips 20 in the state of being disposed in parallel at regular intervals at three positions, and V-shaped grooves 22 for supporting the semiconductor wafers 11 formed on the inner side surface (the surface which abuts against the semiconductor wafer 11) of the innermost connecting plate strips 21A.

On the back surface of the thin-plate supporting unit 13, lower supporting holes 23 is provided to be fitted to projection for supporting the lower portion (not shown) formed inside the container body 12 for supporting the lower portion of the thin-plate supporting unit 13, and upper supporting holes 24 is also provided for supporting the upper portion of the thin-plate supporting unit 13.

Figure 8:
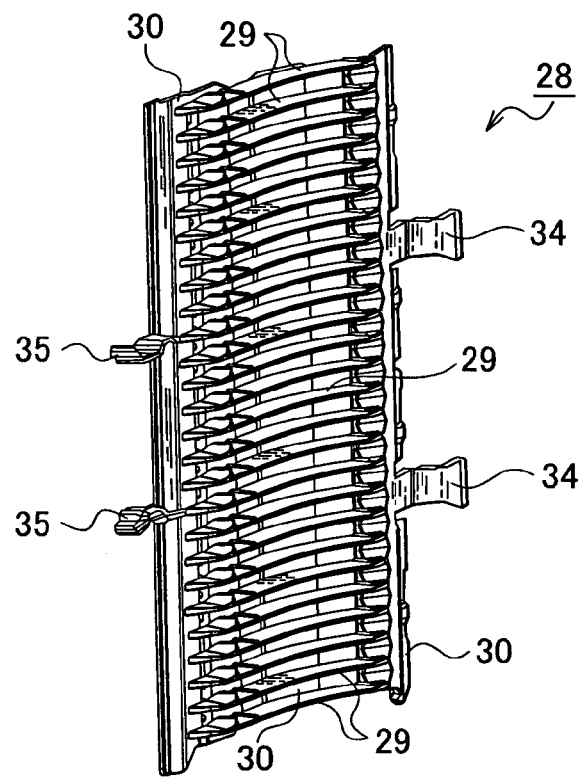
FIG. 8 is a perspective view showing another thin-plate supporting unit of the thin-plate supporting container according to the embodiment of the invention.
Figure 10:
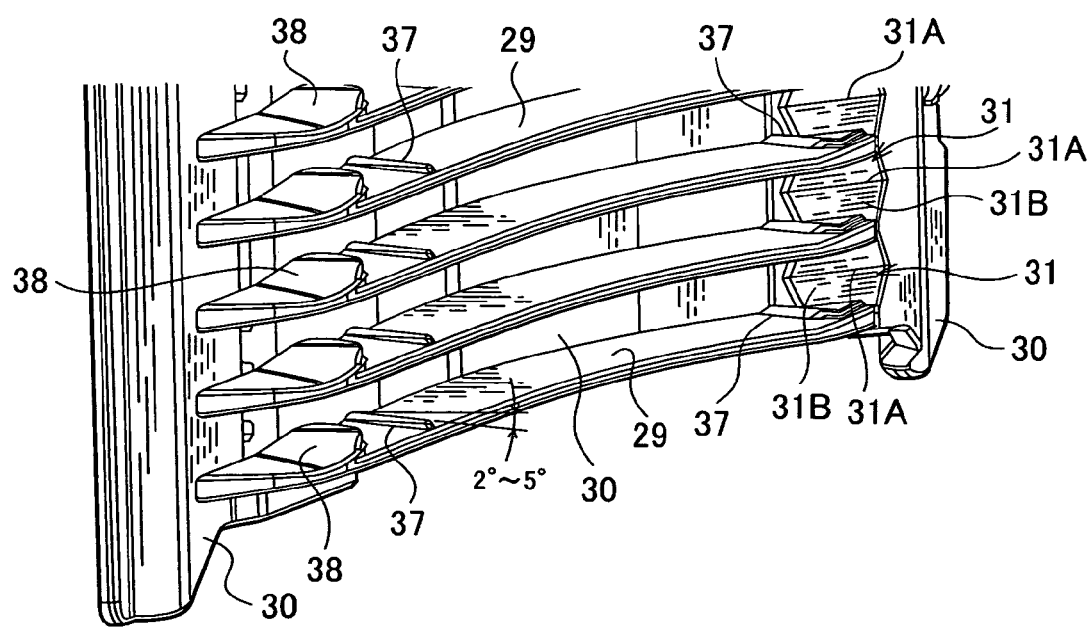
FIG. 10 is a perspective view of a principal portion of another thin-plate supporting unit of the thin-plate supporting container according to the embodiment of the invention.
Figure 9:
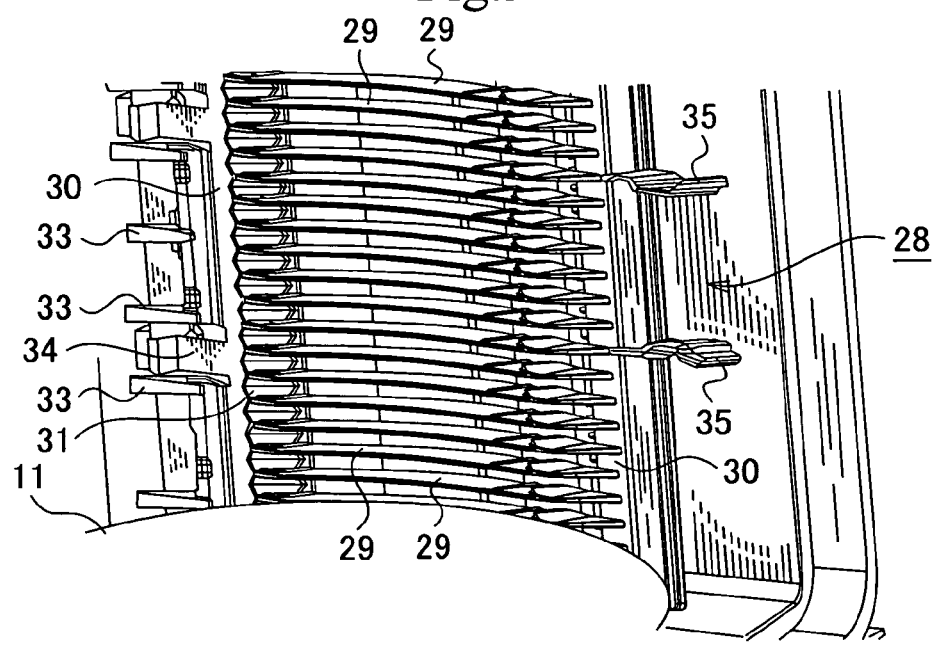
FIG. 9 is a perspective view showing the thin-plate supporting unit of the thin-plate supporting container in another mounted state according to the embodiment of the invention.
Figure 11:
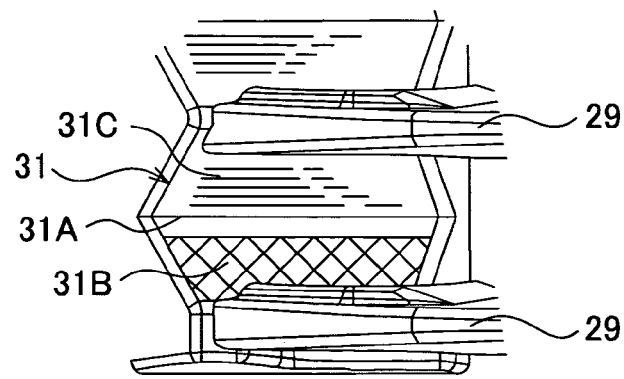
FIG. 11 is an enlarged drawing of a principal portion of a V-shaped groove of the thin-plate supporting unit according to the embodiment of the invention.

The thin-plate supporting unit 13 described above is an example, and in addition to it, there are various types of thin-plate supporting units. An example of other types of thin-plate supporting unit is shown in FIG. 8 to FIG. 10. The general structure of a thin-plate supporting unit 28 is almost the same as that of the thin-plate supporting unit 13, and mainly includes plate supporting strips 29, a connecting plate strip 30, and V-shaped grooves 31.

At the lower end (the right end in FIG. 8) of the thin-plate supporting unit 28, there are provided lower portion fixing strips 34 for fixing the lower portion of the thin-plate supporting unit 28 in a state of being fitted to lower portion supporting devices 33 provided in the container body 12, an upper portion fixing strip (not shown) fitted to an upper portion supporting projection(not shown) for supporting the upper portion of the thin-plate supporting unit 28, and hand grips 35 used for holding the thin-plate supporting unit 28 by hand.

The plate supporting strip 29 is provided with ridges 37 and a stopper 38. The ridge 37 is a member coming into direct contact with the semiconductor wafer 11 for supporting the semiconductor wafer 11 horizontally. The ridges 37 are provided two on the inner side (the right side in FIG. 10) and two on the front side (the left side in FIG. 10) of the plate supporting strip 29 (that is, four in total on the left and right sides). The ridge 37 on the inner side is opposed to the V-shaped groove 31. The ridge 37 on the front side is provided about at the front of the position where a frictional force with respect to the semiconductor wafer 11 placed on the ridge 37 and a force that the semiconductor wafer 11, which is placed on a lower surface 31B of the V-shaped groove 31, described below, which will slide along the lower surface 31B by its own weight, are balanced. When the ridge 37 is provided at the position where the frictional force and the sliding force are balanced, the semiconductor wafer 11 does not always slide on the lower surface 31B of the V-shaped groove 31. Therefore, it is necessary to provide the ridge 37 at the position forwardly of the above-described balanced position. When the ridge 37 is provided too front, as the problem in the related art, the semiconductor wafers 11 cannot be supported at the correct positions because the plate supporting strips 29 are deflected. Accordingly, the ridge 37 is provided near the front side of the above-described balanced position. The ridge 37 provided in the vicinity of the front side of the balanced position (for example, at the position of the ridge 9B in FIG. 3) supports the semiconductor wafer 11 at the precise position in a state in which the deflection of the plate supporting strip 29 is suppressed, and allows the semiconductor wafer 11 to slide smoothly.

Figure 3:
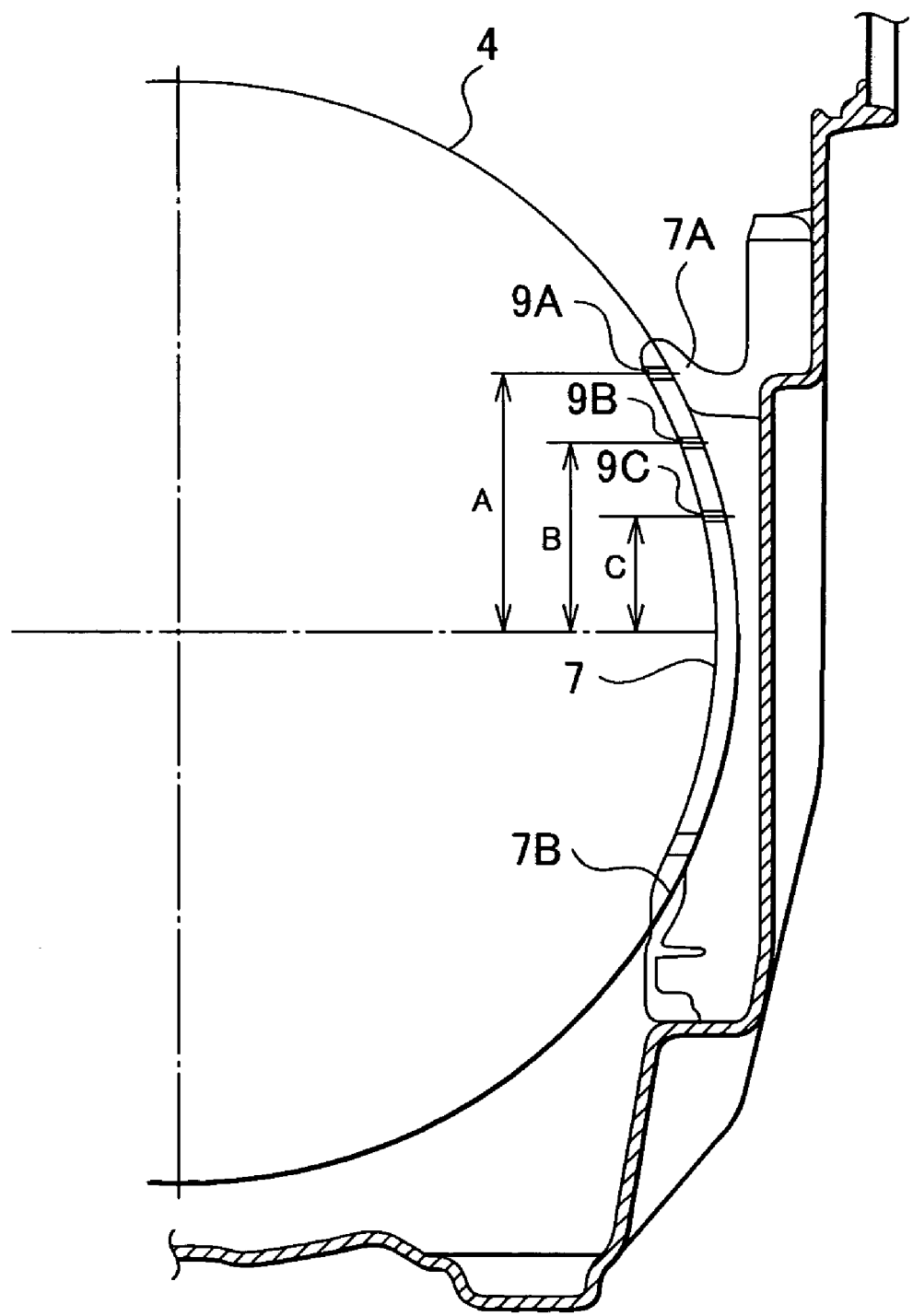
FIG. 3 is a cross-sectional side view showing a principal portion of the thin-plate supporting container in the related art.

The result of the experiment conducted by changing the position of the ridge 37 will be described below. More specifically, the experiment was conducted at three positions (the position of ridges 9A, 9B, and 9C) as shown in FIG. 3. The diameter of the semiconductor wafer 11 was 300 mm and the thin-plate supporting container 10 for the semiconductor wafer 11 of 300 mm was used. The position of the ridge 9A was determined to be 69±10 mm from the center of the semiconductor wafer 11 (a distance A in FIG. 3), the position of the ridge 9B was determined to be 50±10 mm from the center of the semiconductor wafer (a distance B in FIG. 3), and the position of the ridge 9C is determined to be 30±10 mm (a distance C in FIG. 3) in a state in which the semiconductor wafers 11 are stored in the thin-plate supporting container 10 (in a state in which the semiconductor wafers 11 are slide from the lower surfaces 31B of the V-shaped grooves 31 and placed on the four ridges 37). The results of the experiments conducted for these setting values will be shown below.

In the case of the position of the distance A, the sliding movement of the semiconductor wafer 11 on the lower surface 31B of the V-shaped groove 31 was good, the existence value of the wafer in a state in which the plate supporting strip 29 (7A) was deflected was bad, and the existence value of the wafer in the state of being on the four ridges 37 was good. As regards the position of the distance B, the sliding movement of the semiconductor wafer 11 on the lower surface 31B of the V-shaped groove 31 was normal, the existence value of the wafer in a state in which the plate supporting strip 29 (7A) was deflected was normal, and the existence value of the wafer in the state of being placed on the four ridges 37 was normal. As regards the position of the distance C, the sliding movement of the semiconductor wafer 11 on the lower surface 31B of the V-shaped groove 31 was bad, the existence value of the wafer in a state in which the plate supporting strip 29(7A) was deflected was good, and the existence value of the wafer in the state of being placed on the four ridges 37 was bad.

Here, the existence value of the wafer is a value representing how the position of the semiconductor wafer 11 in the thin-plate supporting container 10 is close to the ideal position. The terms "the existence value of the wafer is good, normal, and hard" are index representing the amount of shift of the semiconductor wafer 11 from the ideal position. The indexes of "good", "normal", and "hard" are all included in the range of the shift amount that allows the semiconductor wafer 11 to be taken in and out automatically by the transporting device without problem. The range which is the closest to the idea position is represented by "good", the state in which the amount of shift is gradually increased is represented by "normal", and "hard", respectively depending on the amount of shift within the range in which no problem is caused.

From the result of the experiments, it is understood that the position at 50±10 mm from the center of the semiconductor wafer 11 (the distance B) is the optimal position for the thin-plate supporting container 10 for the semiconductor wafer 11 of 300 mm. The ridge 37 at the distance B can support the semiconductor wafer 11 at the precise position in a state in which deflection of the plate supporting strip 29 is suppressed, and allows the semiconductor wafer 11 to slide smoothly.

In addition, the front and rear four ridges 37 are inclined downwardly with respect to the horizontal direction at an angle of 2 to 5 degrees. The reason why the ridges are inclined downwardly with respect to the horizontal direction at an angle of 2 to 5 degrees is because a good result was achieved in the range of the angle of 2 to 5 degrees as a result of the experiment conducted for various angles of inclination of the ridges 37. When the ridges 37 are oriented in the horizontal direction or inclined upward, there is a possibility that the back surfaces of the semiconductor wafers 11 are scratched. Also, when the angle of downward inclination is 6 degrees or larger, the hosizontality of the semiconductor wafers 11 is significantly changed when the semiconductor wafers 11 are shifted in a lateral direction even though it is a small degree. Furthermore, when the angle of downward inclination is too small, the friction is increased, and hence slipping property is deteriorated. Therefore, in the range of 2 to 5 degrees described above, in which there is no possibility to scratch the back surfaces of the semiconductor wafers 11, variations in horizontality of the semiconductor wafers 11 are small, and the slipping property with respect to the semiconductor wafers 11 is good, is selected. The specific angle may be determined on an experimental basis considering conditions since it may change according to the conditions such as the size of the semiconductor wafer 11 or the material of the thin-plate supporting container 10.

The V-shaped groove 31 is a member for supporting the semiconductor wafer 11 at the center between the adjacent two plate supporting strips 29. In other words, it is a member for supporting the semiconductor wafer 11 at the center position between the adjacent two plate supporting strips 29 by allowing the peripheral portion of the semiconductor wafer 11 to fit into a groove bottom 31A positioned at the center (the center between the adjacent two plate supporting strips 29) of the V-shaped groove 31 in a state in which the container body 12 is placed in the vertical direction. The V-shaped groove 31 is formed as shown in FIGS. 10 to 13. The V-shaped groove 31 is configured as shown in FIGS. 10 to 13. The V-shaped groove 31 includes the lower surface 31B and an upper surface 31C, and the cross-sectional shape is formed into a V-shape. The V-shaped groove 31 is provided on the innermost side (the left end of FIG. 9) of the plate supporting strip 29.

In addition, the lower surfaces 31B of the V-shaped grooves 31, which are located on the lower side in a state in which the container body 12 is plated sideways (the state in which the semiconductor wafers 11 are disposed so as to be oriented in the horizontal direction) are roughened. To roughen the lower surfaces 31B means to be formed the entire surface with depression and projections of about 10 to 15 μm formed thereon at a density of about 20,000 to 30,000/cm². When the lower surfaces 31B is finished with excessively high degree of accuracy, the semiconductor wafer 11 and the lower surfaces 31B comes into excessive contact with each other. Consequently, the frictional resistance increases, and hence smooth slippage is impaired. In contrast, when the surface is roughened, the semiconductor wafer 11 and the lower surfaces 31B do not come into hermetical contact with each other, and the frictional resistance is reduced. Therefore, the lower surface 31B is roughened in a state in which the depressions and projections of about 10 to 15 μm remain.

There are various means for toughening the surface of the lower surfaces 31B. The lower surfaces 31B may be roughened by grinding or sand blasting, or may be formed with depressions and projections of about 10 to 15 μm by roughening the surface of the portion of a metal mold corresponding to the lower surfaces 31B. Any means may be employed as long as the depressions and projections of about 10 to 15 μm can be formed on the lower surfaces 31B at a density of 20,000 to 30,000/cm².

The range to be roughened on the surface of the lower surface 31B is a portion other than the groove bottom 31A. Since the groove bottom 31A has to support the semiconductor wafer 11 by abutting against the peripheral portion of the semiconductor wafer 11, it is preferable that the bottom groove 31A is not slippery. Therefore, the surface of the groove bottom 31A is not roughened and is finished into a surface with a normal accuracy.

Figure 13:
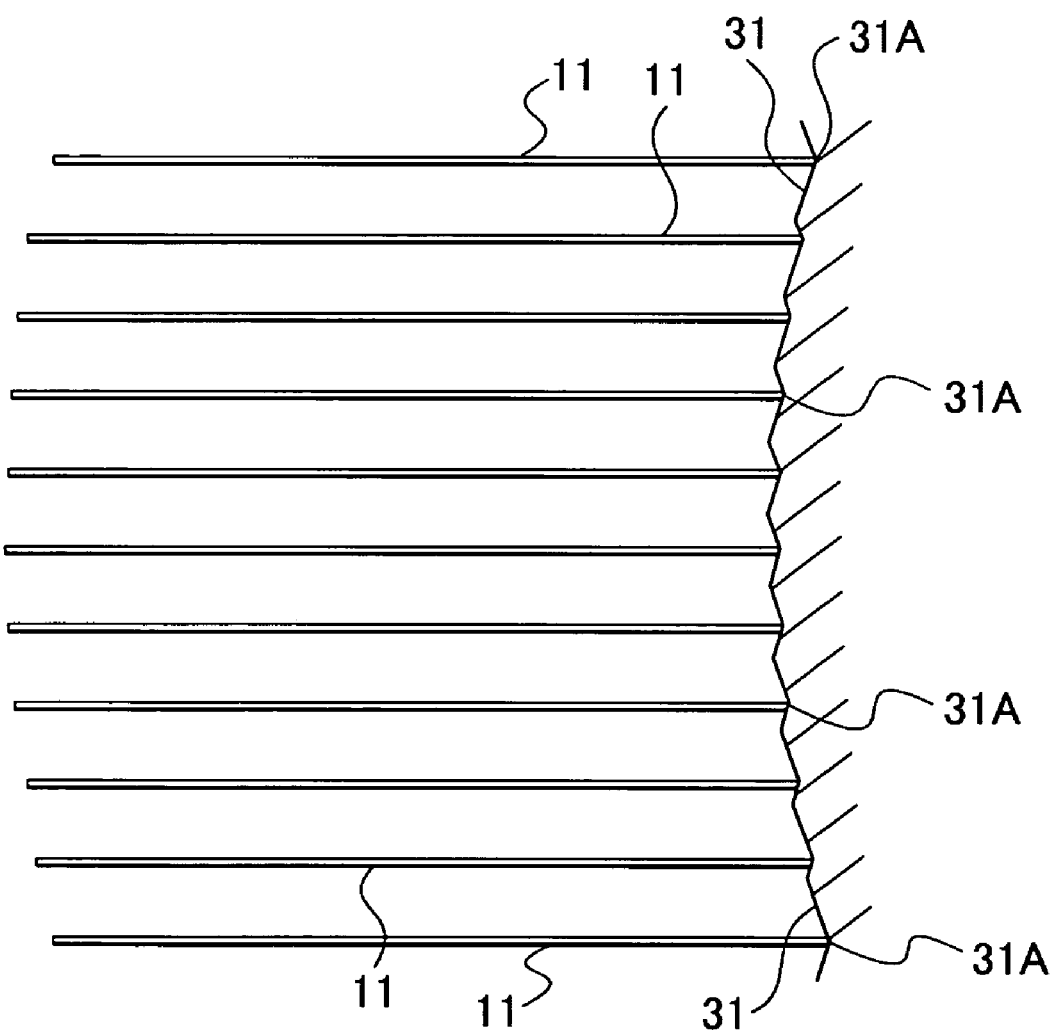
FIG. 13 is a general cross-sectional view showing a groove bottom of the V-shaped groove of the thin-plate supporting unit according to the embodiment of the invention.
Figure 14:
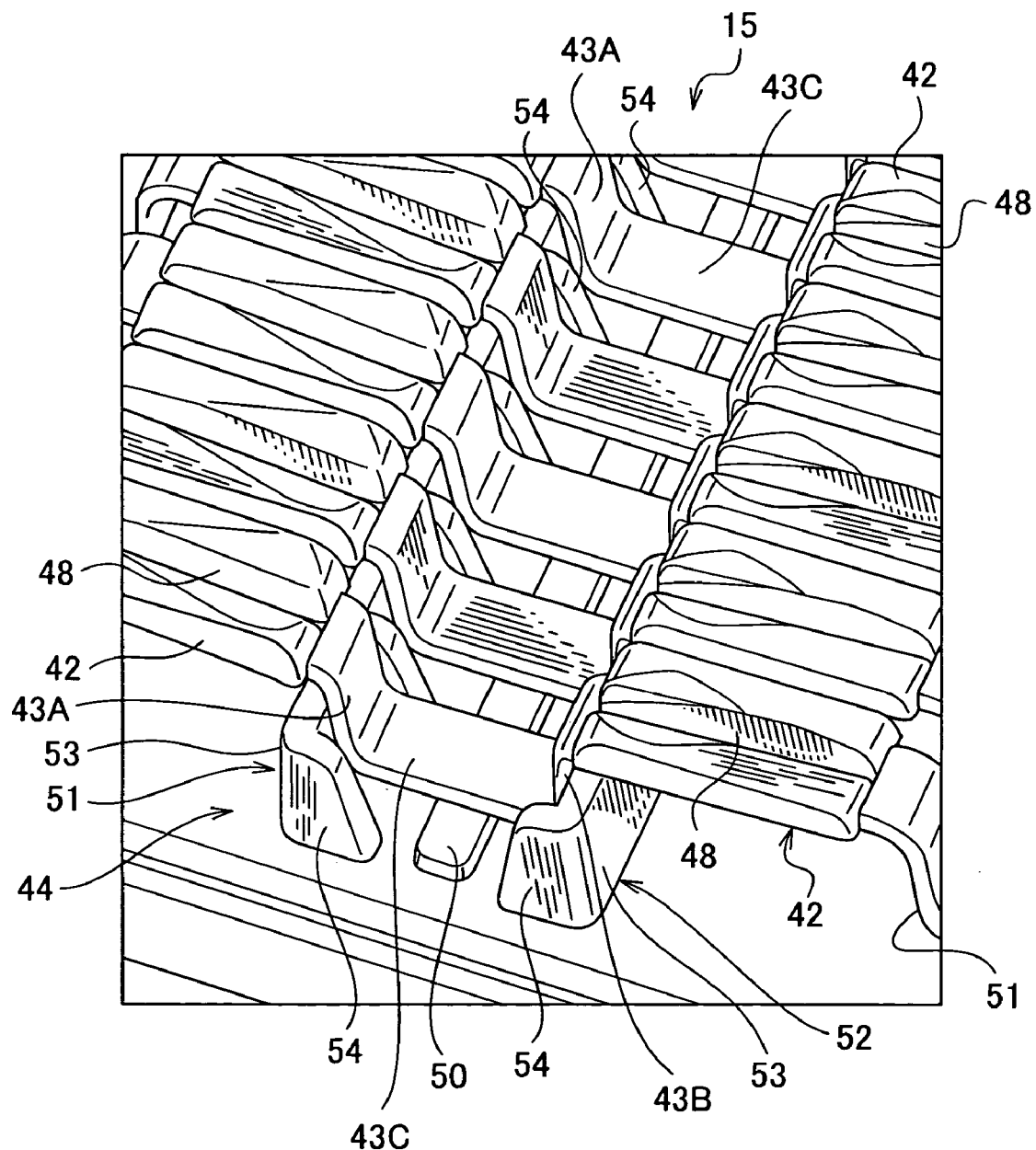
FIG. 14 is an enlarged view of a principal portion showing a wafer holding unit of the thin-plate supporting container according to the embodiment of the invention.

The height of the groove bottoms 31A of the V-shaped grooves 31 which are located at both end portions are different from that of the center portion. More specifically, as shown in FIG. 13, the groove bottoms 31A of a number of V-shaped grooves 31 disposed in parallel are aligned so as to protrude toward the lid unit 14 at the center portion with respect to the both end portions. The groove bottoms 31A are arranged to form a curved line such as part of a circle or part of an oval. The curve line that defines the positions of the respective groove bottoms 31A to be arranged is determined so as to correspond to the shape of deflection of the wafer holding units 15. If the strength of the lid unit 14 is not enough, when the wafer holding units 15 fit the plurality of semiconductor wafers 11 and press and support the same, the wafer holding units 15 are deflected together with the lid unit 14 as a reaction. At this time, the positions of the respective groove bottoms 31A to be arranged are determined corresponding to the shape of the deflected wafer holding units 15. Accordingly, the ends of the respective semiconductor wafers 11 on the side of the wafer holding units 15 are arranged corresponding to the shape of deflection of the wafer holding units 15, and hence the respective semiconductor wafers 11 are pressed and supported by the wafer holding units 15 with a uniform force.

In the description of the thin-wall supporting unit 13 described above, description about the V-shaped groove 31 and the ridge 37 of the thin-plate supporting unit 28 is not made. However, the same members are provided in the thin-plate-supporting unit 13 as well. The V-shaped groove 31 and the ridge 37 of the thin-plate supporting unit 28 are mainly described below.

Figure 15:
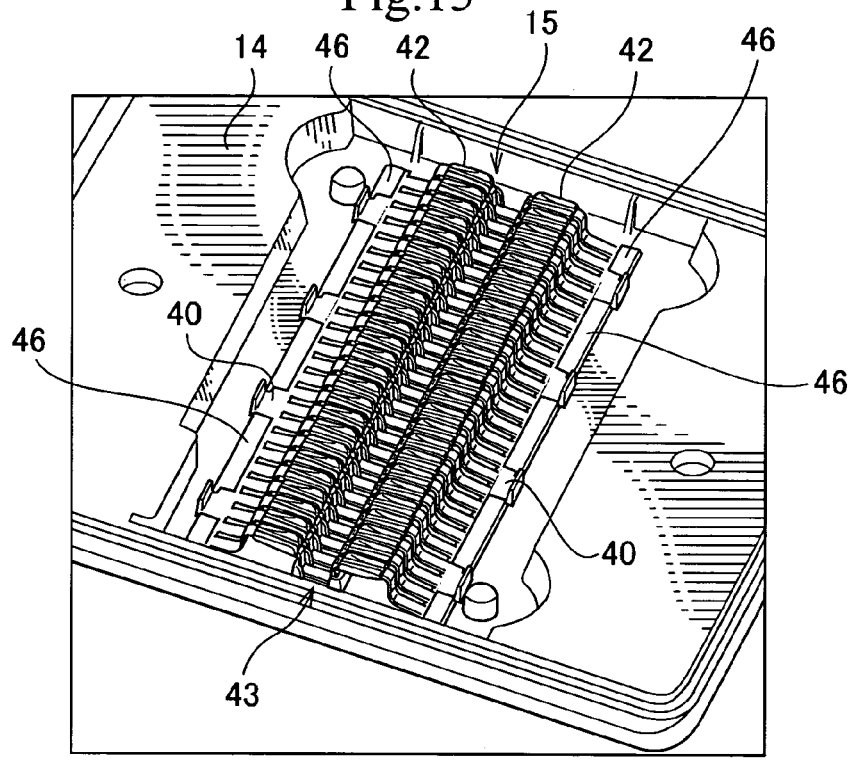
FIG. 15 is a perspective view of the lid unit of the thin-plate supporting container shown from the back surface according to the embodiment of the invention.
Figure 16:
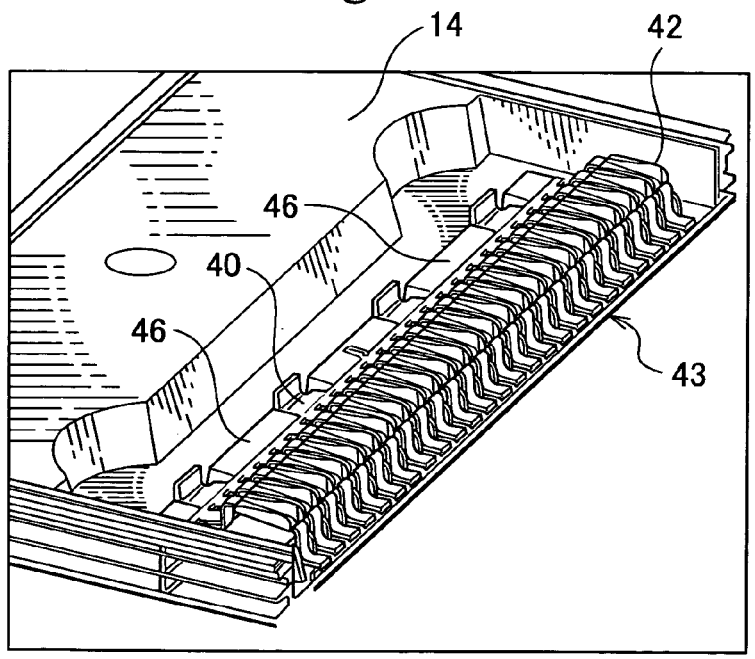
FIG. 16 is a perspective view showing a principal portion of the lid unit of the thin-plate supporting container according to the embodiment of the invention.

As shown in FIGS. 4, 15, and 16, the lid unit 14 is formed into a substantially flat plate and is fitted to the lid unit receiving member 18 of the container body 12. The lid unit 14 is provided with simplified attaching-and-detaching mechanisms 26 at four corners thereof. The locking claws (not shown) of the simplified attaching-and-detaching mechanism 26 fit the receiving devices 18A, 18B of the lid unit receiving member 18 so that the lid unit 14 is fixed to the container body 12.

Figure 18:
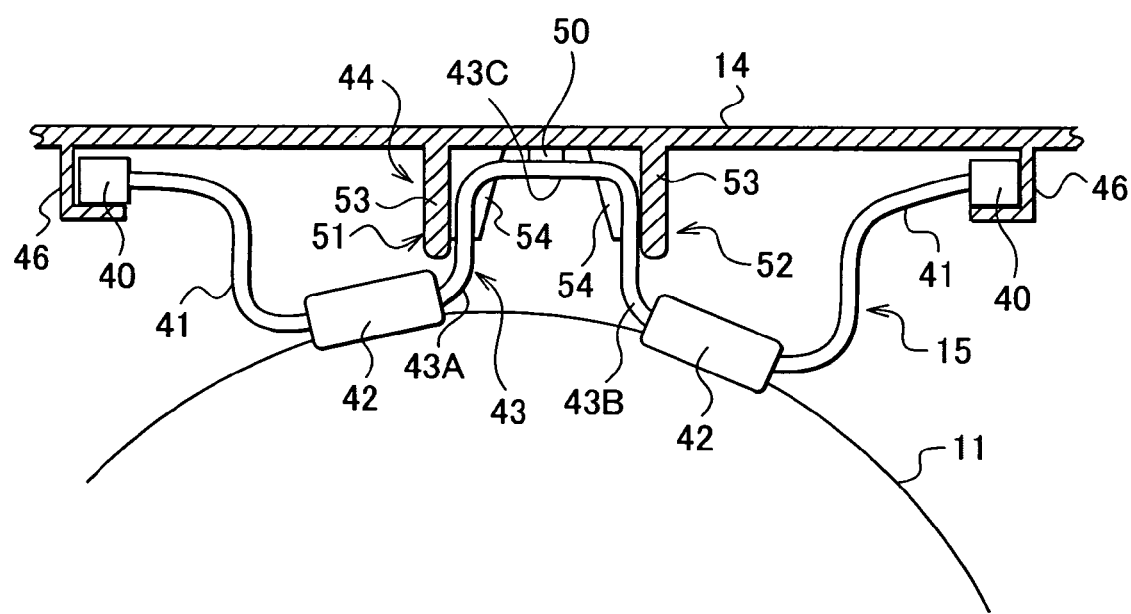
FIG. 18 is a cross-sectional view showing the wafer holding unit of the thin-plate supporting container according to the embodiment of the invention.

The wafer holding unit 15 includes proximal end supporting portions 40, resilient supporting plate portions 41, contact strips 42, a supporting plate connecting member 43, and a supporting rib 44 as shown in FIG. 18.

As shown in FIG. 14 to FIG. 18, the proximal end supporting portions 40 are members provided at both ends of the wafer holding unit 15 respectively for supporting the two resilient supporting plate portions 41 directly. The proximal end supporting portion 40 is formed into a square rod shape and extends along the entire longitudinal length (the vertical direction in FIG. 15) of the wafer holding unit 15. The lid unit 14 is provided with two hook-shaped supporting members 46 on the lower surface of the lid unit 14. The proximal end supporting portion 40 is fitted into the respective hook-shaped supporting members 46 and is fixed to the back surface of the lid unit.

The resilient supporting plate portion 41 is a member for resiliently supporting the outer ends of the contact strips 42. Two of resilient supporting plate portions 41 are aligned by the number of semiconductor wafers 11 stored in the container body 12. Each resilient supporting plate portion 41 is fixed to the proximal end supporting portion 40 in a state of being lined up sideways. The resilient supporting plate portion 41 is formed by being bent into an S-shape in side view. The two resilient supporting plate portions 41 are fixed at the proximal portions thereof to the two proximal end supporting portions 40 respectively, and are provided with the contact strips 42 at the extremities thereof, respectively, so that the respective contact strips 42 are resiliently supported.

The contact strip 42 is a member coming into direct contact with the peripheral portion of each semiconductor wafer 11 for directly supporting each semiconductor wafer 11. One side surface of each contact strip 42 is formed with a V-shaped groove 48 to which the semiconductor wafer 11 fits as shown in FIG. 1. The V-shaped groove 48 supports the semiconductor wafer 11 from the lid unit 14 side by allowing the peripheral portion of the semiconductor wafer 11 to be fitted into the groove bottom. The area of a lower side surface 48A of the V-shaped groove 48, which is positioned on the lower side when the semiconductor wafers 11 are oriented in the horizontal direction (in a state in which the container body 12 is placed sideways), is increased. More specifically, the angle of inclination relative to the horizontal is increased to increase its area relative to that of the upper surface. Accordingly, the lower end of the lower side surface 48A is extended downward. As a consequence, the lower end of the lower side surface 48A positioned below the semiconductor wafer 11 which is shifted downward. The state in which the semiconductor wafer 11 is shifted downward means the state in which the container body 12 is placed sideways so that the respective semiconductor wafers 11 are displaced from the V-shaped grooves 22 of the thin-plate supporting unit 13 and onto the plate supporting strips 29 (the state of the semiconductor wafer 11A in FIG. 1). Furthermore, the surface of the lower side surface 48A is roughened like the lower surface 31B of the V-shaped groove 31.

The supporting plate connecting member 43 is a member for connecting the two contact strips 42 with each other for supporting the same, as shown in FIG. 14 to FIG. 18. The both ends of the supporting plate connecting member 43 are connected to the respective contact strips 42 respectively for resiliently supporting the respective contact strips 42. The supporting plate connecting member 43 is formed into a substantially U-shape in side view. More specifically, it includes vertical plate portions 43A, 43B on both sides and a lateral plate portion 43C. The vertical plate portions 43A, 43B are disposed in the vertical direction on the back surface of the lid unit 14, and can hardly be deflected to support the respective contact strip 42.

The lateral plate portion 43C is adapted to be deflected resiliently. The lateral plate portion 43C takes charge of a large part of the function of the supporting plate connecting member 43 for resiliently supporting the respective contact strip 42. The lateral plate portion 43C is disposed so as to extend along the back surface of the lid unit 14 in a state in which the vertical plate portions 43A, 43B are connected to both ends thereof. The lateral plate portion 43C is supported by a supporting ridge 50, which will be described later, at the central portion thereof, so that the both ends of the lateral plate portion 43C is deflected with respect to the supporting ridge 50 as a point of support.

The supporting rib 44 is a supporting member for supporting the supporting plate connecting member 43 for preventing the same from shifting in the direction along the back surface of the lid unit. The supporting rib 44 are provided at the center of the back side of the lid unit 14. The supporting rib 44 is provided so as to cover a number of supporting plate connecting members 43 of the wafer holding unit 15 entirely. More specifically, the supporting rib 44 has a length which can fit all the supporting plate connecting members 43 lined up by the number corresponding to the number of the semiconductor wafers 11 to be stored therein. The supporting rib 44 includes two supporting walls 51, 52.

The supporting walls 51, 52 are opposed in parallel with each other. The supporting walls 51, 52 each include a supporting plate 53 and a partitioning plate 54.

The supporting plate 53 is a member for supporting the vertical plate portions 43A, 43B of the supporting plate connecting member 43 so as not to be shifted circumferentially of the semiconductor wafer 11 (lateral direction in FIG. 18). The supporting plate 53 supports the vertical plate portions 43A, 43B of the supporting plate connecting member 43 directly and, consequently, supports the respective contact strips 42 indirectly so as not to be shifted circumferentially of the semiconductor wafer 11.

The partitioning plate 54 is a plate strip for partitioning a number of supporting plate connecting members 43 disposed therein from each other. The partitioning plate 54 is disposed respectively at the outermost positions and between adjacent supporting plate connecting members 43. Accordingly, the respective partitioning plates 54 supports the respective supporting plate connecting members 43 from the both sides in the widthwise direction. Accordingly, the respective partitioning plates 54 directly support the supporting plate connecting members 43 and hence indirectly support the respective contact strips 42 so as to prevent the respective contact strips 42 from shifting in the direction orthogonal to the circumferential direction of the semiconductor wafer 11.

When the supporting plate connecting members 43 are clamped from around (in the direction orthogonal to the circumferential direction of the semiconductor wafers 11 stored in the container body 12) and supported individually by the supporting plate 53 and the partitioning plate 54, the supporting plate connecting members 43 are prevented from shifting in the direction along the back surface of the lid unit, and are allowed to move in the direction vertical to the back surface of the lid unit.

The distance from the supporting plate 53 and the partitioning plate 54 to the supporting plate connecting member 43 is set to be a small gap, so that they cannot come into contact with each other when vibrations of small magnitude occurred. In other words, when the vibrations are only such extent that the semiconductor wafers 11 slightly vibrate, the supporting plate connecting member 43 does not come into contact with the supporting plates 53 and the partitioning plates 54, but is deflected to absorb the vibrations. When the magnitude of the vibrations increases, the supporting plate connecting member 43 also vibrates to a large extent via the contact strips 42. Therefore, the supporting plate connecting member 43 is adapted to be supported by coming into contact with the supporting plate 53 and the partitioning plate 54.

Provided between the two supporting walls 51, 52 of the supporting rib 44 is the supporting ridge 50. The supporting ridge 50 is a member coming into direct contact with the respective supporting plate connecting members 43 for supporting the same. More specifically, the center of the lateral plate portion 43C of each supporting plate connecting member 43 abuts against the supporting ridge 50 and supported by the same, so that the both ends of the lateral plate portion 43C can be deflected freely. The supporting ridge 50 is provided at the center between the two supporting walls 51, 52 opposed in parallel with each other so as to extend in parallel with the supporting walls 51, 52 and to have the same length as the supporting walls 51, 52.

Figure 17:
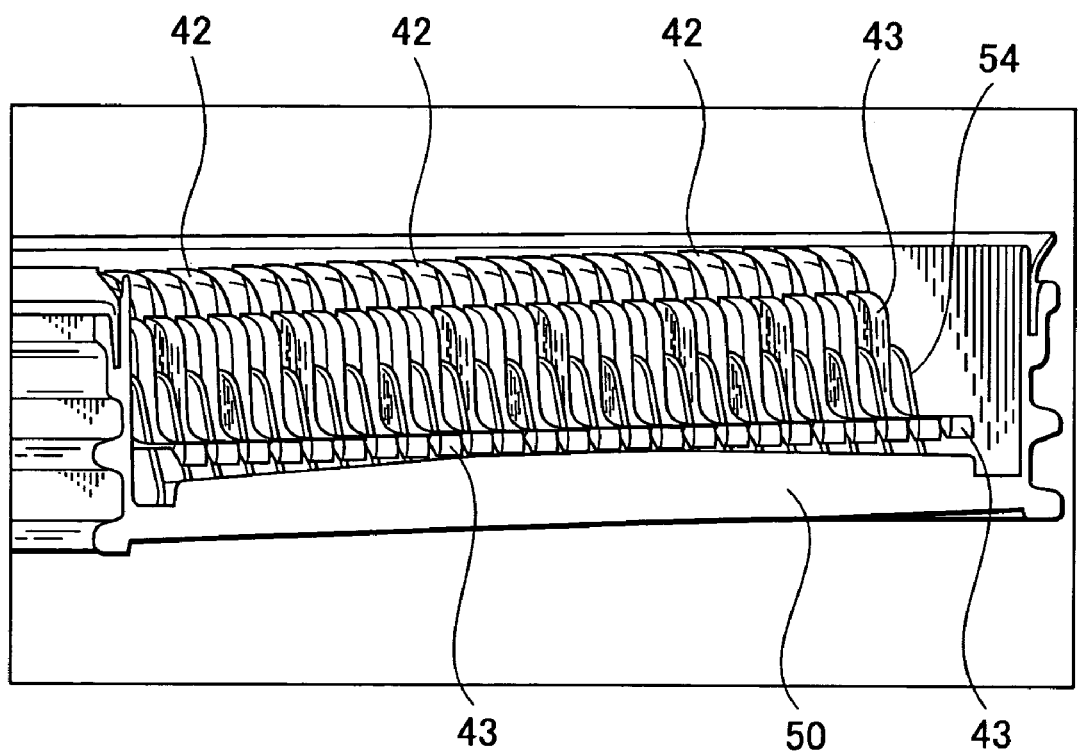
FIG. 17 is a cross-sectional view showing a principal portion of the lid unit of the thin-plate supporting container according to the embodiment of the invention.

The supporting ridge 50 is configured as shown in FIG. 17. In other words, the both ends are thinner and the center portion is thicker so that the contact strips 42 located at the center is protruding toward the semiconductor wafer 11 in comparison with the contact strips 42 disposed on both sides. In this embodiment, the entire shape is curved. Accordingly, the distances to the respective supporting plate connecting members 43 are determined to be wide on both sides and narrow at the center in a state in which the wafer holding unit 15 is mounted to the lid unit 14. The specific dimension of the supporting ridge 50 is determined adequately according to the amount of deflecting of the lid unit 14 considering the shape of the groove bottoms 31A of the V-shaped grooves 31 of the thin-plate supporting unit 28.

The reason why the supporting ridge 50 is shaped as described above is as follow. When the lid unit 14 is attached in a state in which the plurality of semiconductor wafers 11 are stored in the container body 12, a certain repulsive force acts on the lid unit 14. Since the wafer holding unit 15 mounted to the back surface of the lid unit supports the respective semiconductor wafers 11 one by one with a constant force, the repulsive force that presses back the wafer holding unit 15 increases as the diameter of each semiconductor wafer 11 increases and the force to support the specific semiconductor wafer 11 increases, and as the number of semiconductor wafers 11 to be supported increases. With this repulsive force, the lid unit 14 attached to the wafer holding unit 15 deflects outward. Then, when the lid unit 14 deflects outward, a force to support the semiconductor wafers 11 by the wafer holding unit 15 is reduced at the center portion. In order to solve the nonuniformity of the force to support the semiconductor wafers 11, the supporting ridges 50 are provided. Deflection of the lid unit 14 is absorbed by the supporting ridge 50 being thicker at the center portion thereof, and hence the wafer holding unit 15 supports the respective semiconductor wafers 11 with a uniform force.

The operation of the thin-plate supporting container 10 thus configured is as follows.

Figure 12:
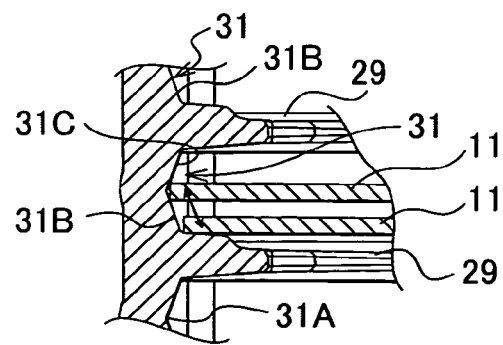
FIG. 12 is an enlarged cross-sectional view of a principal portion showing the V-shaped groove of the thin-plate supporting unit according to the embodiment of the invention.

When the semiconductor wafers 11 are inserted into the container body 12 in a state in which the container body 12 is placed sideways, the semiconductor wafers 11 are placed on the plate supporting strips 29 of the thin-plate supporting unit 28. At this time, the semiconductor wafer 11 is placed on the four ridges 37 of the plate supporting strip 29. When the semiconductor wafer 11 is placed slightly too inside, the peripheral edge of the semiconductor wafer 11 on the inner side may be placed on the lower surface 31B of the V-shaped groove 31. In this case, as shown in FIG. 12, the semiconductor wafer 11 placed on the lower surface 31B slides downward along the inclined lower surface 31B by its own weight. Accordingly, the semiconductor wafer 11 is securely supported by the four ridges 37 on the plate supporting strip 29, and is oriented in the horizontal direction in an orderly fashion in the container body 12.

When the lid unit 14 is mounted in this state, the wafer holding unit 15 of the lid unit 14 comes into abutment with the respective semiconductor wafers 11. At this time, the lower end of the lower surface 48A of the V-shaped groove 48 of the wafer holding unit 15 is positioned downwardly of the semiconductor wafer 11 placed on the plate supporting strip 29, and hence the lower surface 48A scoops the semiconductor wafer 11 and guides the same to the groove bottom of the V-shaped groove 48. In other words, the V-shaped groove 48 of each contact strip 42 fits the peripheral edge of each semiconductor wafer 11 individually and guides the peripheral edge of each semiconductor wafer 11 to the groove bottom of the V-shaped groove 48.

At the same time, each semiconductor wafer 11 is pressed inwardly of the container body 12, and the peripheral portion of each semiconductor wafer 11 is pressed upward along the lower surface 31B of the V-shaped groove 31 of the thin-plate supporting unit 28. Accordingly, each semiconductor wafer 11 is guided to the groove bottom 31A of the V-shaped groove 31 from the plate supporting strip 29.

As described above, when mounting the lid unit 14 to the container body 12, since the surface of the V-shaped groove 48 of the wafer holding unit 15, which is located on the lower side when the semiconductor wafer 11 is oriented in the horizontal direction, is increased so that the V-shaped groove 48 fits the peripheral edge of the semiconductor wafer 11 in the horizontal state smoothly, the lid unit 14 can be attached easily to the container body 12 without fine adjustment of the lid unit 14. Consequently, attachment-and-detachment of the lid unit 14 can be easily automated with the attachment-and-detachment device or the like.

Furthermore, when the lid unit 14 is attached to the container body 12, the wafer holding unit 15 and the lid unit 14 are deflected as a counter reaction against the wafer holding unit 15 which presses and supports the respective semiconductor wafer 11. However, since the groove bottom 31A of the V-shaped groove 31 and the supporting ridge 50 are disposed according the shape of deflection of the wafer holding unit 15 or the like, the respective semiconductor wafers 11 are pressed and supported with a uniform force. In other words, since the V-shaped grooves 31 are formed in such a manner that the groove bottoms 31A of the V-shaped grooves 31 are aligned so as to protrude at the center portion thereof toward the lid unit 14 with respect to the both end portions, the positions of the upper ends of the respective semiconductor wafers 11 are aligned so as to protrude toward the lid unit 14 at the center portion with respect to the both ends in a state in which the respective semiconductor wafers 11 are fitted to the groove bottoms 31A with the container body 12 oriented in the vertical direction, the positions of the upper ends of the semiconductor wafers 11 are aligned so as to follow the shape of the wafer holding unit 15 which is deflected together with the lid unit 14. Consequently, the wafer holding unit 15 presses and supports the semiconductor wafers 11 with a uniform force.

On the other hand, when the lid unit 14 is removed from a state in which the plurality of semiconductor wafers 11 are stored in the container body 12 and the lid unit 14 is attached, the semiconductor wafers 11 are not held by anything. Therefore, the peripheral edges of the semiconductor wafers 11 slide downward along the lower surface 31B of the V-shaped groove 31 of the thin-plate supporting unit 28, and are placed on the four ridges 37.

At this time, since the surface of the lower surface 31B of the V-shaped groove 31 is roughened, and the ridges 37 are inclined in the range between 2 to 5 degrees, the frictional force generated between the semiconductor wafers 11 and the ridges 37 is reduced, and hence the semiconductor wafer 11 is smoothly and surely slid downward along the lower surface 31B from the state in which the peripheral portion of the semiconductor wafer 11 is placed on the lower surface 31B, and is placed on the four ridges 37. In other words, a force that the semiconductor wafer 11 slides along the lower surface 31B of the V-shaped groove 31 overcomes the frictional force which acts on the semiconductor wafer 11 placed on the ridges 37, and hence the semiconductor wafer 11 slides along the lower surface 31B of the V-shaped groove 31, and placed securely on the four ridges 37 without being caught by the lower surface 31B and inclined. In addition, since the ridges on the front side 37 are located at the positions where the frictional force and the sliding force are balanced, the semiconductor wafer 11 can be placed at a precise position horizontally while avoiding deflection of the plate supporting strip 29, and hence all the semiconductor wafers 11 are arranged in an orderly fashion.

Accordingly, the respective semiconductor wafers 11 are supported horizontally at precise positions in a state in which the container body 12 is placed sideways and the lid unit 14 is removed. Consequently, the fork unit of the transporting device is prevented from touching the semiconductor wafers 11 when being taking in or out by the transporting device.

In other words, since the semiconductor wafer 11 placed on the roughened lower surface 31B of the V-shaped groove 31 slides along the inclined lower surface by its own weight and placed on the plate supporting strip 29, the semiconductor wafers 11 are prevented from being caught by the lower surfaces of the V-shaped grooves 31 and hence prevented from being inclined when the container body 12 is place sideways and hence the semiconductor wafers 11 are oriented in the horizontal direction, and all the semiconductor wafers 11 are arranged in an orderly fashion. As a consequence, automatization of attachment and detachment of the lid unit 14 and taking in and out of the semiconductor wafers 11 may be achieved easily.

Although the angle of inclination of the lower surfaces 48A of the V-shaped grooves 48 of the wafer holding unit 15 are moderated as a method of increasing the area in the above-described embodiment, it is also possible to increase the area without changing the angle of inclination of the lower surface 48A. It must simply be configured to increase the area of the lower surface 48A so that the lower end of the lower surface 48A is located below the semiconductor wafer 11 and the semiconductor wafer 11 can be scooped in a state in which the container body 12 is placed sideways and hence the semiconductor wafers 11 are placed on the plate supporting strips 29, and all the lower surfaces 48A thus configured are included in the invention.

Figure 19:
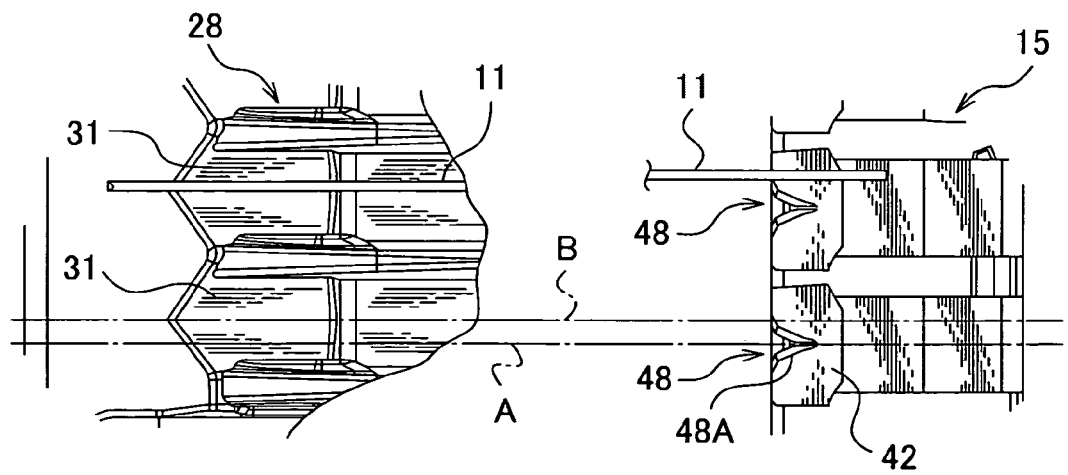
FIG. 19 is an enlarged view of a principal portion of a modification of the invention.
Figure 2:
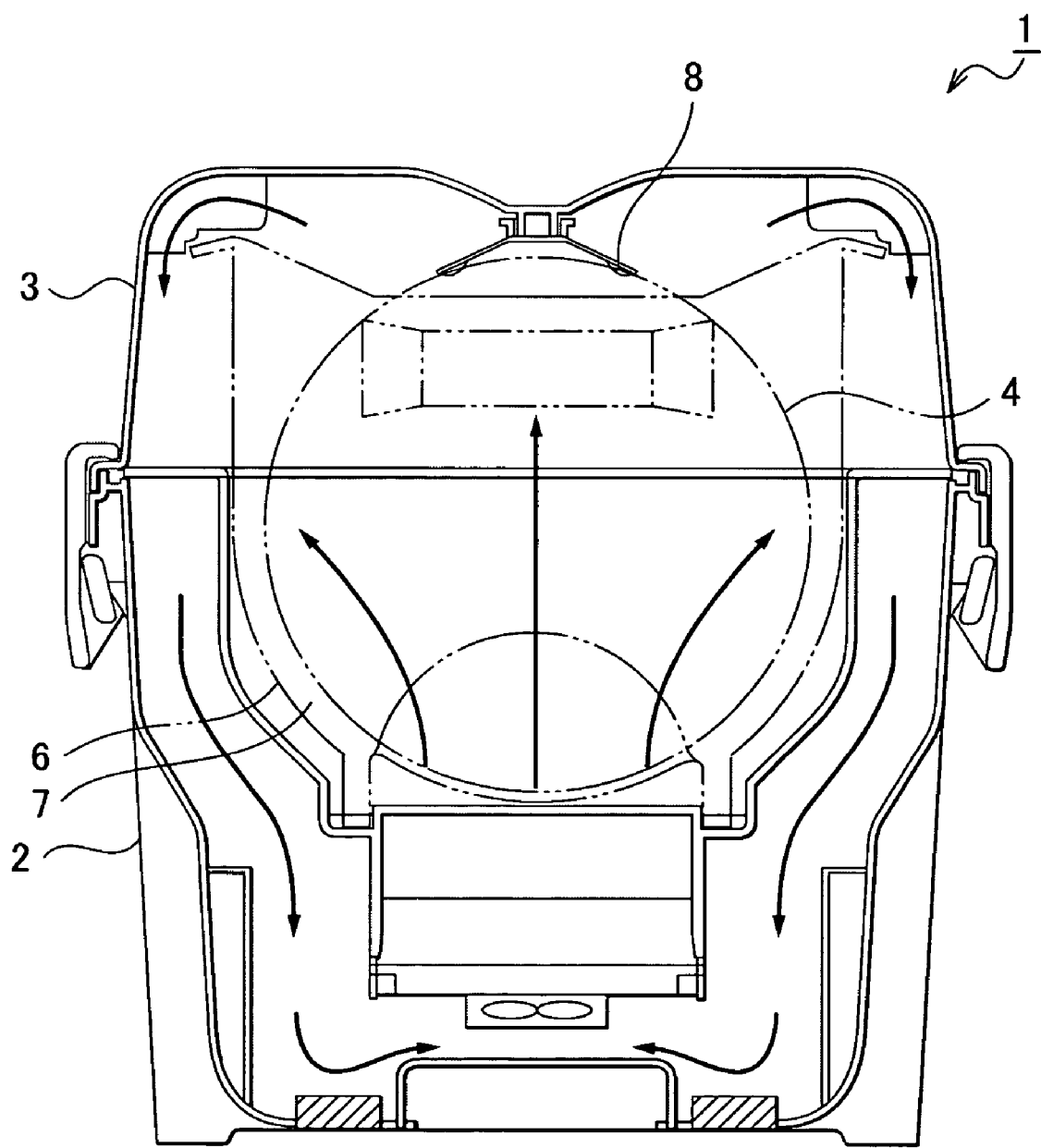
FIG. 2 is a cross-sectional side view showing a thin-plate supporting container in the related art.

Alternatively, it is also possible to form the upper and lower surfaces symmetrically without increasing the area of the lower surface 48A of the V-shaped groove 48, and the V-shape groove 48 itself is shifted downward (downward in the state in which the container body 12 is placed sideways) as shown in FIG. 19. In other words, a centerline A passing through the groove bottom of the V-shaped groove 48 may be shifted downwardly of a centerline B of the V-shaped groove 22 of the thin-plate supporting unit 13. Alternatively, it is also applicable to increase the area of the lower surface 48A and then the V-shaped groove 48 is shifted downward. Although the amount of the shift of the V-shaped groove 48 differs depending on the conditions such as the dimensions of the wafer holding unit 15 or the like, the V-shaped groove 48 is shifted at least to the position at which the lower end of the lower surface 48A of the V-shaped groove 48 is located below the semiconductor wafer 11 and hence the semiconductor wafer 11 can be scooped. Normally, it is shifted downward by about 20% of the width of the V-shaped groove 48. Since the position at which the lower end of the lower surface 48A of the V-shaped groove 48 is located below the semiconductor wafer 11 differs depending on various conditions such as the size of the semiconductor wafer 11, the positions are determined depending on the conditions. Therefore, it may be 19% or below of the width of the V-shaped groove 48, or may be 21% or higher.

In these cases, as in the above-described embodiment, since the V-shaped groove 48 fits the peripheral edge of the semiconductor wafer 11 oriented in the horizontal direction smoothly without the necessity of fine adjustment of the lid unit 14, the lid unit 14 can be attached easily to the container body 12. Accordingly automatization of attachment and detachment of the lid unit is facilitated.

Although the V-shaped groove 48 of the wafer holding unit 15 is formed into a precise V-shape in the above-described embodiment, the shape of the V-shaped groove 48 is not limited to the precise V-shape. V-shape grooves having gradually different angle, grooves having a shape near to a U-shape, grooves which are almost U-shape, and other shapes of groove may also be applicable. The invention includes all the V-shape grooves in which the lower end of the lower surface 48A is located below the semiconductor wafer 11 so as to be capable of scooping the semiconductor wafer 11. The lower surface 48A is not necessarily required to be a flat shape. It may take any shape as long as it can scoop the semiconductor wafer 11.

In this case as well, the same operation and effects as the above-described embodiment are achieved.

In the above-described embodiment, the wafer holding unit 15 is exemplified as a thin-plate holding unit for supporting the thin plates stored in the container body. However, the invention is not limited thereto, and may be applied to the thin-plate holding unit of other structure. In this case as well, the same operation and effects as the above-described embodiment will be achieved.

In the embodiment described above, the thickness of the supporting ridge 50 of the wafer holding unit 15 is changed for supporting the respective semiconductor wafers 11 at a uniform force (as measure taken on the side of the lid unit 14). However, the strength of the wafer holding unit 15 may be changed alternatively. More specifically, the thicknesses of the resilient support plate 41 and the vertical plate portions 43A, 43B of the supporting plate connecting member 43 are changed. The thickness of the vertical plate portions 43A, 43B of the supporting plate connecting member 43 and the resilient supporting plate portion 41 at the center are increased to reinforce the same. Accordingly, the portion of the lid unit 14 which is deflected and weakened is reinforced. It is also possible to change the thickness of the proximal end supporting portion 40 to make the lid unit 14 scarcely deflected. Consequently, the semiconductor wafer 11 can be pressed and supported with a uniform force by the wafer holding unit 15. In this case as well, the operation and the effects as in the case of the above-described embodiment are achieved.

The positions of the groove bottoms 31A of the V-shaped grooves 31 are adjusted in the embodiment described above, it is also possible to adjust only the positions of the groove bottoms 31A or to adjust the positions of the V-shaped grooves 31 including the groove bottoms 31A. When adjusting the position of the V-shaped groove 31, the positions of the V-shaped grooves 31 may be aligned so as to protrude toward the lid unit 14 at the center portion when molding the thin plate supporting unit 28. Alternatively, the design in which the thin-plate supporting unit 28 is molded so that the positions of the V-shaped grooves 31 are aligned so as not to protrude toward the lid unit 14, but aligned linearly, so that the thin-plate supporting unit 28 is deformed when mounting the thin-plate supporting unit 28 to the container body 12. More specifically, it is also possible to provide a device such as a projection that deforms the thin-plate supporting unit 28 on the side of the thin-plate supporting unit 28 or on the side of the container body 12, which is the center of the thin-plate supporting unit 28. In this case as well, the same operation and effects as in the embodiment described above are achieved.

Although the supporting ridges 50 are molded to be thinner on both sides and thicker at the center, and the groove bottoms 31A of the V-shaped grooves 31 are aligned so as to protrude at the center toward the lid unit 14 in comparison with the both ends in the embodiment described above, only one of these devices is also possible. In this case as well, the operation and effects as in the embodiment described above are achieved.

Although the surface of the lower surface 31B of the V-shaped groove 31 is roughened in the embodiment described above, it is also possible to roughen both of upper and lower surfaces of the V-shaped groove 31. In this case as well, the same operation and effects as in the case of the above-described embodiment are achieved.

What is claimed is:

1. A thin-plate supporting container comprising:
   a container body for storing a plurality of thin plates therein, the container having a front side opening;
   a lid unit for closing the container body;
   a thin-plate supporting unit provided in the container body for supporting the thin plates stored therein at regular intervals;

a thin-plate holding unit provided on the lid unit for pressing and supporting, from the lid unit side, the thin plates supported by the thin-plate supporting unit provided in the container body; and first V-shaped grooves provided in the thin-plate supporting unit and second V-shaped grooves provided in the thin-plate holding unit for fitting and supporting the thin plates, wherein the second V-shaped grooves of the thin-plate holding unit are defined by upper and lower surfaces extending from a groove bottom and inclined relative to the horizontal, when the container is positioned in a horizontal state with the front side opening facing in a horizontal direction and the V-shaped grooves lying in horizontal planes; and wherein the lower surfaces each have an area larger than the area of an upper surface.

2. A thin-plate supporting container comprising:

a container body for storing a plurality of thin plates therein the container having four sides, a bottom and a front side opening;

a lid unit for closing the container body;

a thin-plate supporting unit provided in the container body for supporting the thin plates stored therein at regular intervals;

a thin-plate holding unit provided on the lid unit for pressing and supporting, from the lid unit side, the thin plates supported by the thin-plates supporting unit provided in the container body; and first V-shaped grooves provided in the thin-plate supporting unit and second V-shaped grooves provided in the thin-plate holding unit for fitting and supporting the thin plates, wherein the first and second V-shaped grooves of the thin-plate holding unit are defined by upper and lower surfaces extending from a groove bottom toward and inclined relative to the horizontal when the container is positioned in a horizontal state with the front side opening facing in a horizontal direction and the V-shaped grooves lying in horizontal planes;

wherein first V-shaped grooves cooperate with second V-shaped grooves to support one thin plate thereon; and wherein, with the container positioned in the horizontal state, the first V-shaped grooves for supporting the one thin plate are centered on a first horizontal plane and the second V-shaped grooves for supporting the one thin plate are centered on a second horizontal plane lower than the first horizontal plane.

3. A thin-plate supporting container according to claim 1 wherein the lower surfaces of the first V-shaped grooves of the thin-plate supporting unit, are roughened.

4. A thin-plate supporting container according to claim 1 wherein the thin-plate supporting unit comprises a plurality of spaced plate supporting strips, on which the thin in a state oriented in the horizontal direction, wherein plate supporting strip is provided with a ridge which comes into direct contact with and supports a thin plate, and the ridge is formed on the front side of a point where a frictional force between one thin plate and a ridge is balanced with a frictional force between the one thin plate and the lower surface of the V-shaped groove of the thin-plate supporting unit.

5. A thin-plate supporting container according to claim 4, wherein, with the front side opening of the container facing upward, the the ridge is inclined at an angle of 2 to 5 degrees with respect to the horizontal.

6. A thin-plate supporting container according to claim 1, wherein the groove bottoms of a number of the first V-shaped grooves have center portions which protrude toward the lid unit relative to end portions of the groove bottoms.

7. A thin-plate supporting container according to claim 1 wherein the thin-plate holding unit is more supported at a center portion than at end portions on opposing sides of the center portion.

8. A thin-plate supporting container according to claim 2 wherein the lower surfaces of the first V-shaped grooves of the thin-plate supporting unit are roughened.

9. A thin-plate supporting container according to claim 2 wherein the thin-plate supporting unit comprises a plurality of spaced plate supporting strips, on which the thin in a state oriented in the horizontal direction, wherein plate supporting strip is provided with a ridge which comes into direct contact with and supports a thin plate, and the ridge is formed on the front side of a point where a frictional force between one thin plate and a ridge is balanced with a frictional force between the one thin plate and the lower surface of the V-shaped groove of the thin-plate supporting unit.

10. A thin-plate supporting container according to claim 2, wherein the groove bottoms of a number of the first V-shaped grooves have center portions which protrude toward the lid unit relative to end portions of the groove bottoms.

11. A thin-plate supporting container according to claim 2 wherein the thin-plate holding unit is more supported at a center portion than at end portions on opposing sides of the center portion.

12. A thin-plate supporting container according to claim 1 wherein, with the container in the horizontal state, the lower surfaces have a greater angle of inclination relative to the horizontal than the upper surfaces.

* * * * *

UNITED STATES PATENT AND TRADEMARK OFFICE
CERTIFICATE OF CORRECTION

PATENT NO. : 7,357,258 B2 Page 1 of 1
APPLICATION NO. : 10/896912
DATED : April 15, 2008
INVENTOR(S) : Chiaki Matsutori et al.

It is certified that error appears in the above-identified patent and that said Letters Patent is hereby corrected as shown below:

Column 18, line 3 (claim 4, line 3), "thin in" should read -- thin plate is in --.

Column 18, line 29 (claim 9, line 3), "thin in" should read -- thin plate is in --.

Signed and Sealed this

Twelfth Day of August, 2008

JON W. DUDAS
*Director of the United States Patent and Trademark Office*